June 1, 1965

R. J. OST 3,187,210

HIGH DENSITY PACKAGING COMPACT ELECTRICAL ASSEMBLY

Filed April 23, 1962

5 Sheets-Sheet 1

INVENTOR.
ROBERT J. OST

BY

H P Terry
ATTORNEY

June 1, 1965

R. J. OST 3,187,210

HIGH DENSITY PACKAGING COMPACT ELECTRICAL ASSEMBLY

Filed April 23, 1962

5 Sheets-Sheet 2

INVENTOR.
ROBERT J. OST

BY

H P Ferry
ATTORNEY

June 1, 1965

R. J. OST 3,187,210

HIGH DENSITY PACKAGING COMPACT ELECTRICAL ASSEMBLY

Filed April 23, 1962

5 Sheets-Sheet 3

INVENTOR.
ROBERT J. OST
BY
H. P. Terry
ATTORNEY

INVENTOR.
ROBERT J. OST
BY
H P Ferry
ATTORNEY

June 1, 1965 R. J. OST 3,187,210

HIGH DENSITY PACKAGING COMPACT ELECTRICAL ASSEMBLY

Filed April 23, 1962 5 Sheets-Sheet 5

INVENTOR.
ROBERT J. OST
BY
H P Terry
ATTORNEY

United States Patent Office 3,187,210

Patented June 1, 1965

3,187,210
HIGH DENSITY PACKAGING COMPACT ELECTRICAL ASSEMBLY

Robert J. Ost, Old Bethpage, N.Y., assignor to Sperry Rand Corporation, Great Neck, N.Y., a corporation of New York Filed Apr. 23, 1962, Ser. No. 189,366
7 Claims. (Cl. 317—100)

This invention relates to compact electrical assemblies and methods of manufacturing electrical assemblies compactly. The invention specifically relates to efficiently packaging a large number of miniature electronic assemblies known as building blocks in order that minimum space is occupied while preserving reliability in the circuits comprising the electric modules as well as in the over-all assembly. The modules include a plurality of building blocks while the over-all assembly includes a plurality of modules.

In the development and utilization of electrical equipment and particularly digital computers, the physical size of the over-all equipment becomes more and more important as the degree of complexity and the number of electrical components in the equipment package increase. The problem is to provide the highest density of electrical components within a given volume while maintaining reliability of the electrical circuits and insuring structural integrity of the over-all package. This problem becomes particularly acute when the equipment is utilized in air or space craft where it is subject to extremes in usage environments including extremes in temperature variation.

Previous attempts to overcome this problem utilized printed circuit "mother board" techniques having overlapping layers of wiring in a printed circuit board. This technique has a severe disadvantage resulting from the mother board having a number of encapsulated building blocks connected to it, the mother board exhibits large deflections when subjected to moderately severe vibrations or shock loading. The deflections of the mother board cause failures in the soldered connections as well as structural failures. Further, the mother board technique requires soldered connections which are inferior to welded connections such as used in the technique of the present invention. In addition, the over-all package becomes much larger with the mother board technique because components or modules can be mounted on only one side of the board rather than both sides of a central member as with the present invention. The connections between mother boards generally employ conventional wiring techniques which are relatively bulky and tend to result in more wiring failures because the wires are not rigidly supported and under the influence of accelerations tend to break. The wiring cannot be rigidly supported since it must have a certain flexibility to adjust to tolerances thereby rendering it susceptible to breakage. Further, when large numbers of connections between assemblies are required, it is necessary to use mechanical mating devices which embody high loads upon the assembly and utilize an excessive amount of space.

Another serious disadvantage of the mother board technique is that replacement of components, building blocks or modules requires handling all of the assemblies on the mother board with the resulting possibility of damage to other components and component connections. Further, in the design stage the complex intercomponent assembly wiring requires the use of multilayer deposited or printed wiring as the mother board. This is initially expensive and it is difficult to change the program once it has been established.

The present invention overcomes the disadvantages of the prior art devices by providing a structurally rigid over-all assembly which results in a minimum of relative motion between components while maintaining a high packaging density. Further, the use of encapsulated wiring and welded connections which contribute to the structural rigidity and reliability are used throughout which eliminates friction-type connectors and reduces the interconnecting lead lengths. The present invention combines the building blocks, modules and associated conductors in a manner which enhances the mechanical strength of the over-all assembly and substantially eliminates wiring failures. Further, the present invention is adapted to versatile cooling techniques which eliminate the heat generated by the electrical components within the building blocks and the modules. Multilayer wiring techniques also provide flexibility and reliability for the interconnections between the components and provision is also made for ready access to test points whereby at least a portion of each building block may be individually tested while in place.

It is a primary object of the present invention to provide an electrical assembly having a high density of electrical components for a given unit volume wherein the over-all assembly is structurally strong and portions thereof may be readily interchanged.

It is an additional object of the present invention to provide an electrical assembly having a high packaging density wherein the components themselves aid in the structural integrity of the over-all assembly.

It is a further object of the present invention to provide an electrical assembly having a high packaging density in which the building blocks and the modules, although providing a portion of the structural support, are easily interchangeable and they are readily tested from test points accessible at remote locations.

The above objects are achieved by mounting spaced rows of building blocks adjacent to a structural member having a high thermal conductance. The spaces between the rows of modules house channels within which conductors are disposed that connect to terminals protruding from one side of the building blocks while the other extremity of the conductors are connected to respective pins which protrude to provide easy access as test points and for further interconnects. The building blocks, channels, and conductors of the modules all combine to provide structural integrity to the over-all assembly.

Referring to the drawings.

In electrical equipment such as digital computers a large number of circuits are utilized, many of which are interconnected with other circuits of the same or different type. For purposes of example, the present invention will be explained with respect to an electrical assembly having circuits encapsulated by means of an epoxy resin.

Figure 1:
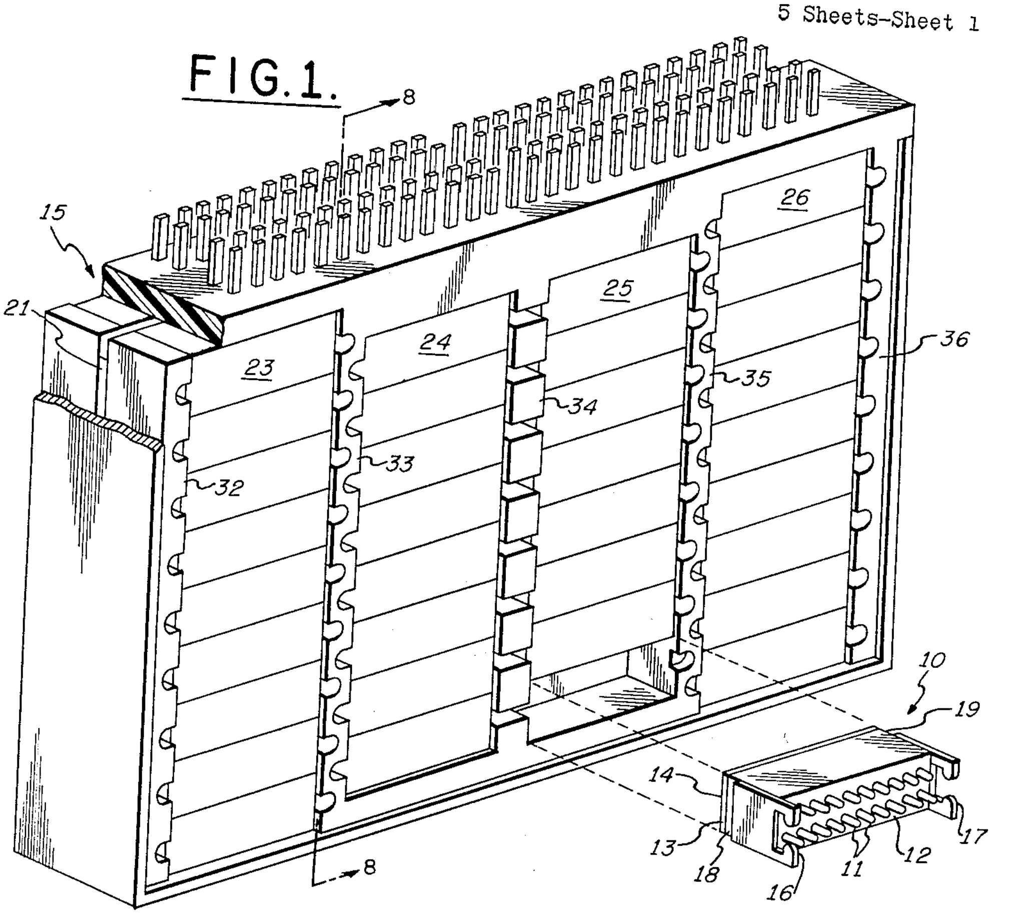
FIG. 1 is a perspective view of a module including a plurality of building blocks.

Referring to FIG. 1, a circuit which may for example be a multi-input logic gate is encapsulated by having its electrical components potted in an electrical component subassembly known as a building block 10. Preferably, the building block 10 is in the form of a rectangular parallelepiped with the terminals 11 of the encapsulated components extending from one side 12 of the block 10. The terminals 11 extending from the block 10 have a predetermined orientation for reasons to be explained with respect to FIG. 2. If desired, the block 10 may also include a heat sink plate 13 mounted on the side 14 of the block 10 opposite the side 12. The heat-generating components and critical temperature elements such as transistors which comprise the block 10 may be mounted against the heat sink 13. This provides a good source of heat removal as well as temperature control by means of the conductance of the heat to the next higher assembly or module 15 in a manner to be more fully described with respect to FIG. 2. The encapsulated building block 10 provides high packaging density of the electrical components therein combined with exceptional ruggedness of the building block 10. The building block 10 in itself forms a structural unit in much the same way that a brick forms a structural unit of a brick wall. Typical packaging densities range from 100,000 to 300,000 electrical components per cubic foot utilizing this arrangement.

The terminals 11 of the encapsulated components which protrude externally from the block 10 are arranged in rows and preferably are fabricated of weldable material having a gold plated finish which permits either welded or soldered connections to be made to the terminals 11. A convenient arrangement is to wire the terminal 11 with a welded ribbon tab for easy welded disconnect by shearing the ribbon. Extractor tabs 16 and 17 are secured to opposite ends 18 and 19 respectively of the block 10. The tabs 16 and 17 are used for inserting and removing the building block 10 in a manner to be more fully described and provide protection for the terminals 11 when the block 10 is resting on its side 12.

Figure 2:
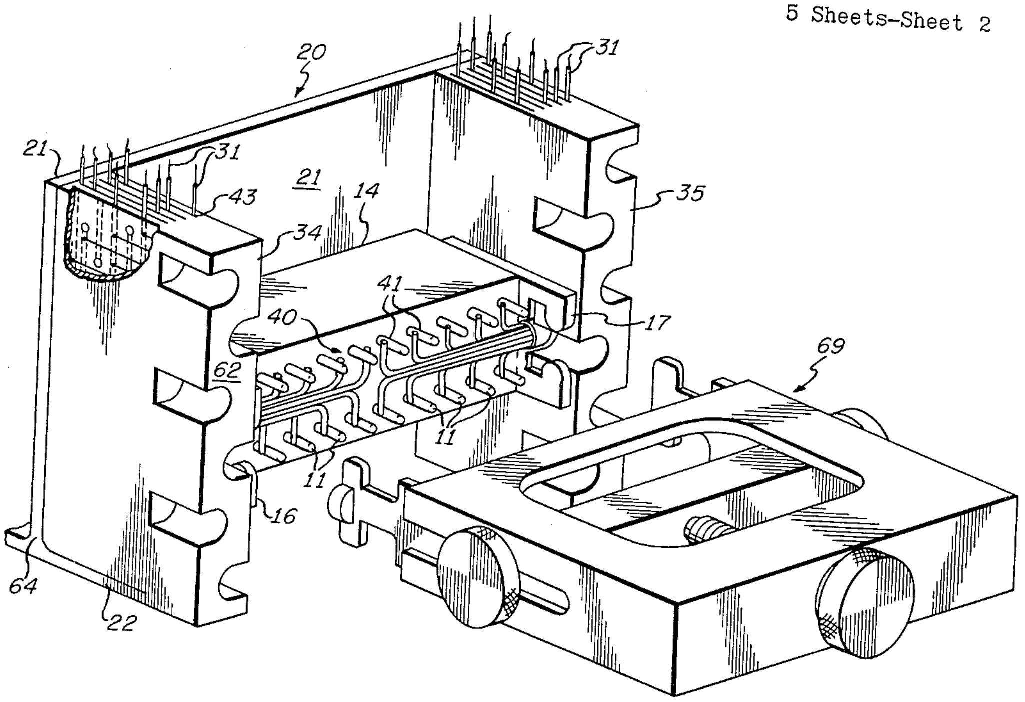
FIG. 2 is an enlarged perspective view of a building block between channels with an extraction tool of the type used to insert and remove the building block.

Referring now to FIG. 2, the module 15 has a structural member 20 having a cross section in the shape of an inverted T formed by a web portion 21 disposed perpendicular to a flange base portion 22. The member 20 not only provide structural rigidity but also has a high thermal conductance in order to readily remove the heat generated in the block 10. This is accomplished by placing the back side 14 of the block 10 against the web portion 21 of the member 20 in a manner to be more fully explained.

A plurality of building blocks 10 are stacked one above the other to provide, for example as shown in FIG. 1, four spaced parallel rows 23, 24, 25 and 26 respectively on each side of the web 21 of the module 15 thereby providing sixty-eight building blocks 10 to a module 15. The building blocks 10 are mounted on both sides of the web 21 to increase the capacity for mounting building blocks 10 on one module 15 thereby reducing the number of modules 15 required for the over-all computer assembly 30, the latter being shown in FIG. 9. This arrangement also affords the opportunity for more direct high reliability wiring connections between building blocks 10. Utilizing this arrangement with welded connections and encapsulated components provides several orders of magnitude greater reliability than other types of connections.

The module 15 further includes welded and encapsulated wiring conductors 31 in each of the channels 32, 33, 34, 35 and 36 located between or adjacent the four rows 23, 24, 25 and 26 respectively of the building blocks 10 on both sides of the web 21. The conductors 31 are connected to respective building blocks 10 by means of respective flying harnesses 40 which issue from the channels 32, 33, 34, 35 and 36 in a manner to be described. Two harnesses 40, 40 which issue from adjacent channels 34 and 35, for example as shown in FIG. 2, connect to the terminals 11 of the block 10 which is disposed between the two channels 34 and 35. In this manner, the channel 34, for example, may contain the various power supply voltages, ground or non-critical functions and the other channel 35 may provide the low level signal functions thereby providing isolation between high and low level signals to prevent possible interference.

The flying harness wiring technique is preferable because other connectors are not considered as reliable due to the reliance upon friction contacts and the two additional connections required for each mating half. In addition, friction connectors require considerably more space and would add significant additional weight. The flying harness method also results in reducing the number of vulnerable connections when compared to connectors or series wiring methods.

The flying harnesses 40 are composed of suitable solid conductor insulated wire. The conductor material is weldable and a standard eight-color code is used to identify the destination of each conductor 41 to the proper building block terminal 11. Where the same color is employed for two different conductors 41, the lengths of the conductors 41 are varied enough so that it would be apparent should an attempt be made to connect them to the wrong terminal 11.

The module 15 has ten channels 32, 33, 34, 35 and 36 on one side and a similar number on the opposite side. However, this may vary depending upon the type of building blocks, sizes and wiring complexity. Each channel, such as 34, is an encapsulated subassembly and is fastened to the module heat sink member 20 with an adhesive that permits a slight degree of flexure without failure. The channel 34 consists of a plurality of different matrix film assemblies 43 as shown in FIG. 3.

Figure 3:
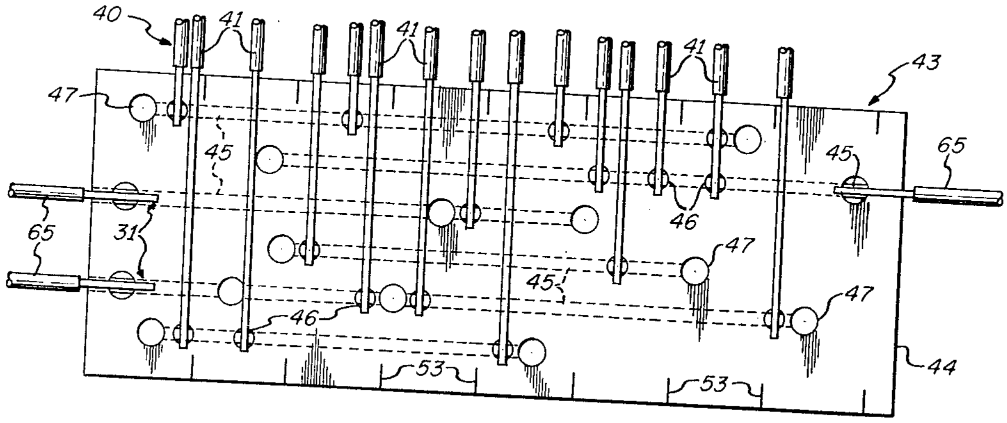
FIG. 3 is a greatly enlarged plan view of a matrix film assembly.
Figure 4:
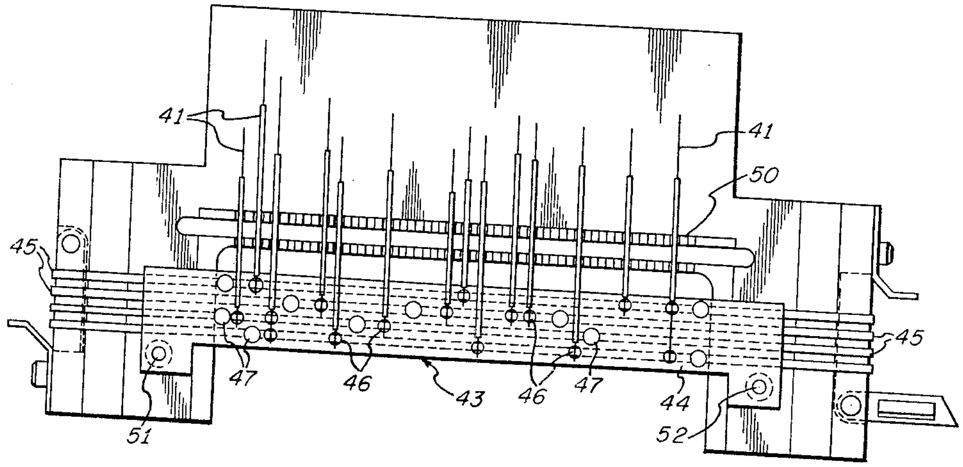
FIG. 4 is a plan view of a fixture for making the matrix film assembly of FIG. 3.

Referring to FIG. 3, a matrix film assembly 43 is fabricated from a Mylar film 44 that is photographically reduced ten to one from a master drawing. The Mylar film 44 has the wiring pattern photographically reproduced upon it. The matrix film assembly 43 further includes a plurality of gold plated nickel ribbons 45 extending parallel with respect to each other which form a portion of the conductors 31. The flying harness riser wires 41 are connected to the respective ribbons 45 in a manner to be explained. The Mylar film 44 has a wiring pattern consisting of, for example, five parallel lines photographically reproduced upon it. Connections 46 between the ribbons 45 and the wires 41 are indicated as black dots on the film 44 while discontinuities of the ribbons 45 are indicated by a circle 47 upon the film 44. The film 44 is prepared by cutting the outline and punching out the black dot connections 46. Five ribbons 45 are placed in a holding fixture 50 shown in FIG. 4. The fixture 50 appropriately spaces the ribbons 45 to be parallel to each other. The film 44 is then positioned in the fixture 50 by means of locating pins 51 and 52 which automatically align the parallel lines on the film 44 with the parallel ribbons 45. The riser wires 41 which have previously been stripped and cut in accordance with a length vs. position schedule are located on the respective punched holes which define the connections 46. Welds are then made through the punched holes to form connections 46 to join the riser wires 41 to the appropriate ribbon 45.

Each film 44 is marked along its length by lines 53 which indicate the building block position to which the riser wires 41 located between two lines 53 are being addressed. Both sides of the film 44 are varnished to prevent breakage during subsequent handling and to secure the ribbons 45 to the film 44. Using the holes 47 as guides, the ribbons 45 are punched out. This permits the same ribbon 45 to be utilized for more than one function along its length. The conductors 31 further include wires 65 welded to respective extremities of appropriate ribbons 45 for reasons to be explained.

Figure 5:
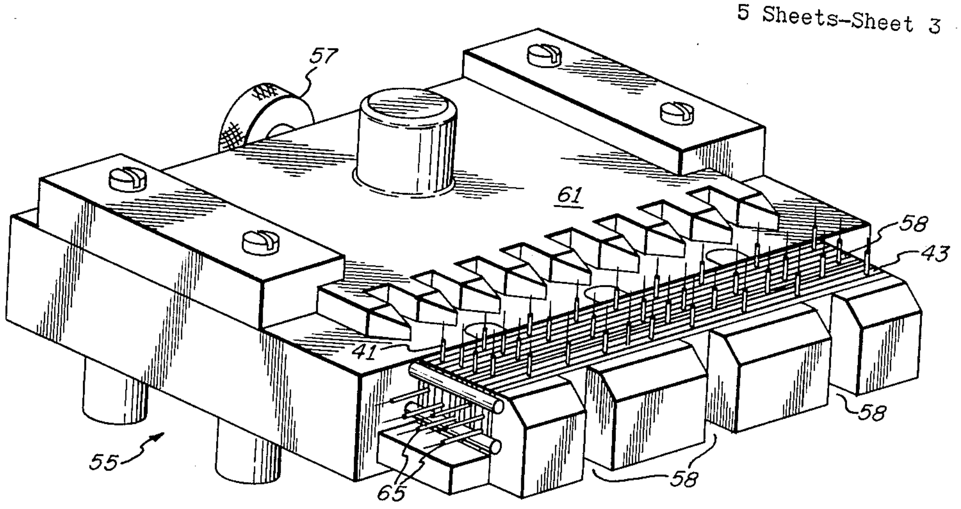
FIG. 5 is a perspective view of a laminating jig for making a bundle of matrix film assemblies for a channel.
Figure 6:
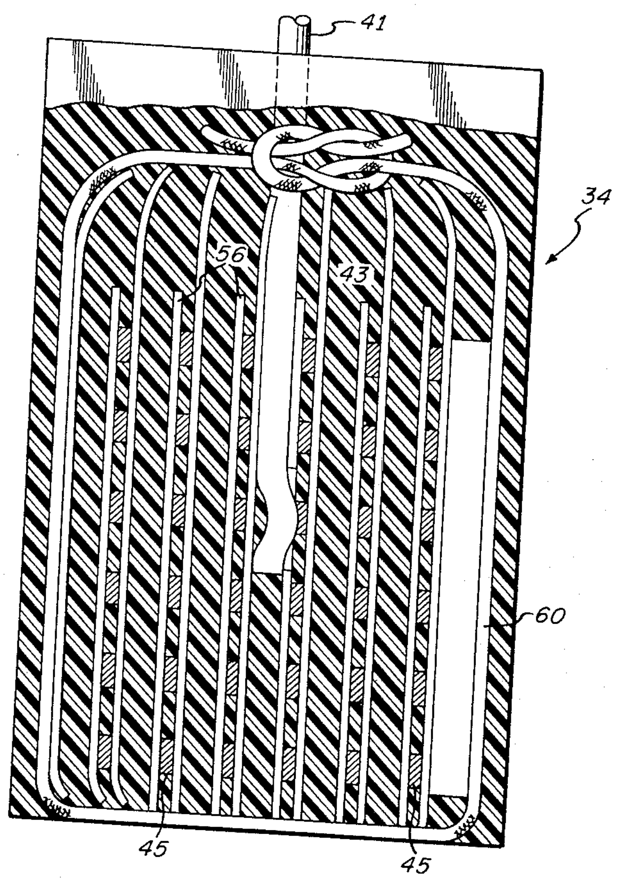
FIG. 6 is an enlarged end view in section of an encapsulated channel assembly.

The plurality of film assemblies 43 to be used in the same channel, for example 34, are placed in a laminating jig 55 shown in FIG. 5 and an insulating film 56 is placed between each film assembly 43 as shown in FIG. 6. Pins at each end of the jig align the film assemblies 43. The jig 55 is closed to the proper dimension by rotating the adjusting screw 57. Three slits 58 in the jig 55 permit tying the film assemblies 43 into a bundle by means of twine 60 as shown in FIG. 6. A comb 61 on the jig 55 is slowly advanced through the riser wires 41 which protrude upwardly as shown in FIG. 5 thereby segregating the riser wires 41 into bundles of flying harnesses 40. The tips of the comb 61 are aligned with respective lines 53 in order that the flying harnesses 40 are properly segregated for the respective building block position in the particular row. Each bundle of flying harnesses 40 is temporarily taped to prevent inadvertent separation while going through the subsequent encapsulation process. The tied film assemblies 43 are then encapsulated in an epoxy resin in a mold to form the individual channel assemblies, for example 34.

Figure 7:
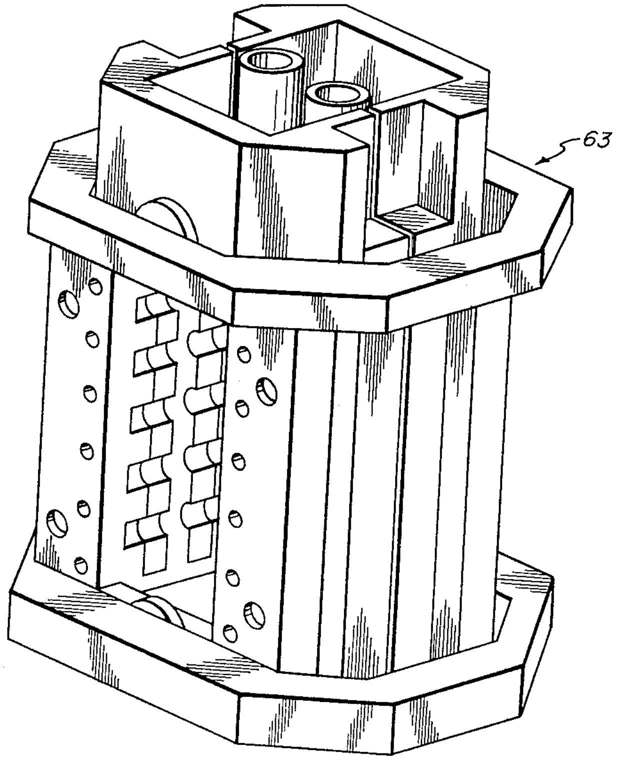
FIG. 7 is a module encapsulating fixture.

Each channel, such as 34, is encapsulated by conventional closed vacuum molding methods with the sprues being plugged before curing in an oven. The plugs have very small sprue holes and leave slight recesses in the channel assembly 34. These small sprues may be broken off below the finished surface thereby avoiding any additional machining. The shape of the channel 34 along its surface 62, shown in FIG. 2, is arranged in order that the surface 62 rests against the corresponding channel surface of the adjacent module in the over-all computer assembly 30 thereby insuring clearance between the terminals 11 of opposing building blocks 10 since the channel 34 protrudes beyond the terminals 11. The encapsulated channels are positioned into respective slots in a module encapsulating fixture 63 shown in FIG. 7 which determines their position with respect to the module 15. An adhesive is applied to the rear surface 64 of the channels and the member 20 is positioned in the mold 63. The split mold 63 is closed to sandwich the web 21 of the heat sink member 20 between the channels 34.

Figure 8:
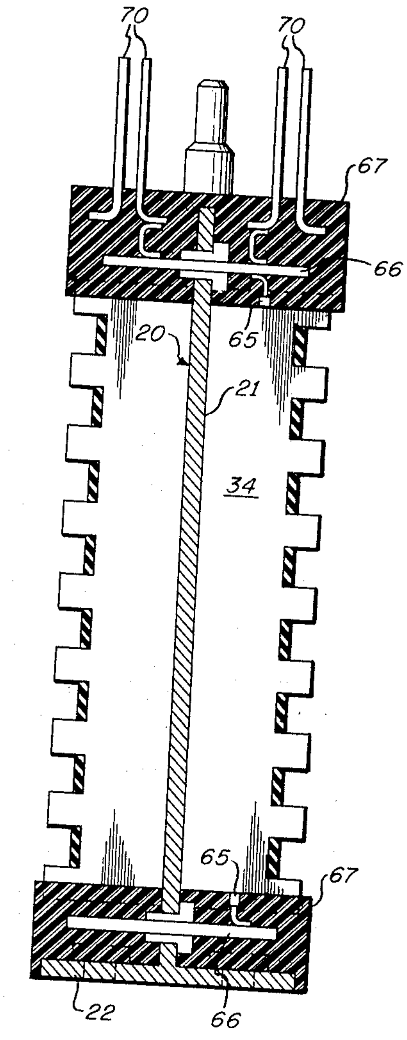
FIG. 8 is an end view in section of a module.

Referring to FIG. 8, interchannel connections are made by connecting one end of the wires 65 to the extremities of the ribbons 45 and the other end of appropriate wires 65 to feed-through riser pins 66 located in insulator strips 67 at the top and bottom of the heat sink member 20 as viewed in FIG. 8. Connections are made from the appropriate riser wires 65 or feed-through pins 66 to the header pins 70 that are held in place by a rubber fixture forming a part of the mold 63. After the aforementioned connections are made, the assembly is placed back into the mold 63 and a temporary sealing is applied in areas where resin leakage might occur during encapsulation. The split mold 63 is closed and the interchannel wiring, header connections and channel ends are vacuum encapsulated with an epoxy resin 67. The resulting assembly of an encapsulated wiring secured to the heat sink member 20 provides an extremely rugged module subassembly having a well protected wiring system.

After the encapsulation described above, as shown in FIG. 2, the building blocks 10 have a semiflexible adhesive applied to the extraction tabs 16 and 17. Each block 10 has its surface 14 pressed firmly against the web 21 of the heat sink member 20 in its respective position. Each block 10 is secured between its respective channels, for example 34 and 35, as shown in FIG. 2, by means of the adhesive on its extractor tabs 16 and 17. The adhesive strength provides a holding force between three to eight pounds per building block 10. With a typical building block weight of .02 pound, the holding force of the adhesive can sustain loads in excess of 100 G's and yet the block 10 is relatively easy to remove with an extraction tool 69. The building blocks 10 are thus fastened only to their respective channels in order that individual replacement of the building blocks 10 may be easily made while precluding relative motion between the other building blocks 10 and the flying harnesses 40 from the channels 34 and 35.

After the building blocks 10 are secured, the harnesses 40 are swung into engagement with their respective terminals 11 and welded. In order that the riser wires 41 are connected to the proper respective terminals 11, the correct position for each building block 10 is marked on the adjacent channel similar to the method employed in assembly racks. A clear, removable coating is applied around the harnesses 40 and terminals 11 to provide a bond to the building blocks 10 which supports the riser wires 41 to prevent relative motion therebetween. The module 15 is now completed.

It will now be appreciated that the heat sink member 20 is the central structural member of the module 15 and conducts heat from the building blocks 10 through its web 21 to its base flange 22. The thickness of the web 21 is dependent upon the amount of heat to be dissipated in the building blocks 10 and the allowable operating temperature of the components within the building blocks 10. Preferably, the heat sink member is made of aluminum to combine rigidity, light weight and high conductivity.

The construction of the module 15 is designed to provide a structural member having no large areas capable of acting as a diaphragm in response to vibration or shock similar to that which occurs on mother boards as explained above. This is made possible by the structural integrity of the module 15 and by utilizing the wiring channels of adjacent modules as structural abutting elements with their respective surfaces 62 contacting as shown more clearly in FIG. 9.

Figure 9:
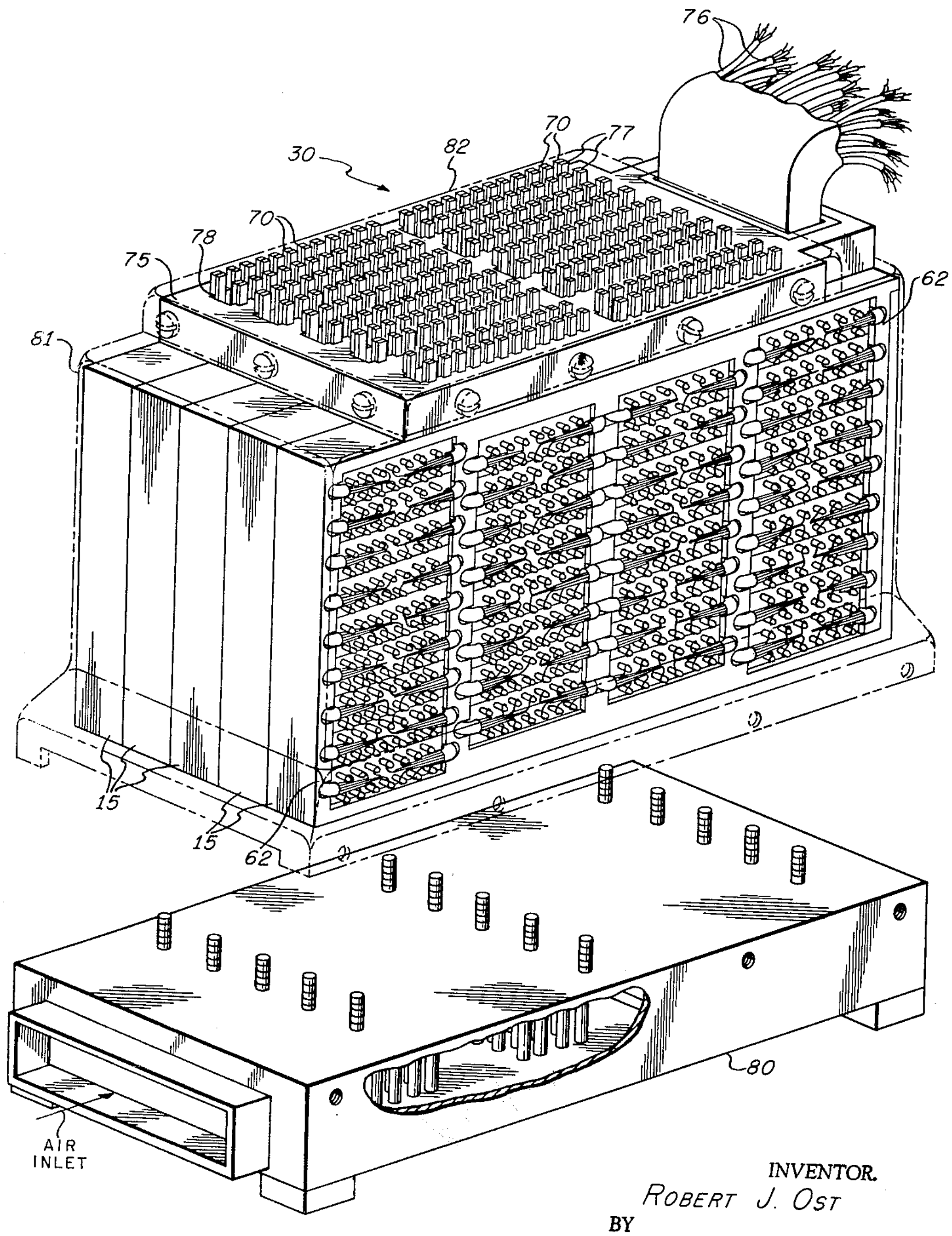
FIG. 9 is an exploded perspective view of an over-all assembly with its cover in phantom.

As shown in FIG. 9, an interconnection panel 75 is mounted on the top of the abutting modules 15 to provide the necessary electrical interconnections between the modules 15 and wires 76 which protrude external to the assembly 30. The wires 76 are connected to equipment external to the assembly 30. The interconnection panel 75 contains rows of pins 77 which mate with respective pins 70 of the modules 15 by means of apertures 78 in the panel 75 which permit the pins 70 to protrude therethrough. The internal construction of the panel 75 consists of multi-layer film matrix construction essentially as described with respect to the similar technique of the channels 34, etc. The wiring within the panel 75 is vacuum encapsulated in an epoxy resin. Threaded inserts and sleeves are molded in the panel 75 for assembly to the modules 15. Generally, the panel 75 is constructed by locating the pins 77 in a fixture that is part of the mold and adding welded matrix film layers one at a time and connecting each layer to the appropriate header pins 77.

The panel 75 is arranged in order that the pins 77 are adjacent to respective pins 70 and then utilizing conventional wiring techniques, the respective adjacent pins 70 and 77 are connected. External connections are achieved by means of a strip harness consisting of conventional solid conductor insulated wires 76 that are welded to respective wire wrap pins 70 and 77 as required. The panel 75 adds to the structural integrity of the over-all assembly 30 and as will be explained more fully, the pins 70 and 77 protrude upwardly to provide convenient accessible test points for the completed assembly 30.

A heat exchanger 80 is connected to the base flanges 22 of the modules 15. The heat exchanger 80 may be of any convenient design depending upon the particular application. The purpose of an external interchangeable heat exchanger 80 is to permit the internal construction of the modules 15 to remain fixed while being able to vary the heat exchanger design to match different heat removal applications. The heat exchanger 80 normally includes extended surfaces such as pins or fins extending from the top portion of the heat exchanger 80 to which the modules 15 attach for efficient heat transfer. The coolant may be either gas or liquid. Preferably, the modules 15 are mounted on the heat exchanger 80 along the coolant flow direction to obtain the best efficiency from the heat exchanger design. The heat exchanger 80 also serves to provide structural integrity of the over-all assembly 30.

The various parts of the computer 30 are assembled together to provide maximum resistance to shock, vibration and temperature. Preferably, the assembly is begun by tack bonding the modules 15 together by applying a frangible adhesive to the surfaces 62. The heat exchanger 80 may for example be screwed to each of the modules 15. The interconnection panel 75 has its pins 77 aligned with the mating pins 70 and may also use adhesive to be screwed to the modules 15. All parts are held together in a manner consistent with good structural practices. The over-all structural effect is to have the modules 15, heat exchanger 80 and interconnection panel 75 operate under shock and vibration as an integral assembly with negligible relative motion between the parts. This is further accomplished by captivating the assembly 30 within a layer of polymethene foam of, for example, twenty pound density.

The assembly of modules 15, heat exchanger 80 and interconnection panel 75 are enclosed in a plastic sack that is partially open at the top to permit the pins 70 and 77 to be exposed. The purpose of the sack is to protect the assembly 30 from the surrounding foam captivation and to permit release from the foam upon disassembly. A cover 81 is then placed over the assembly 30 thereby sealing off the sack and securing it in place. The sack around the pins 70 and 77 is further sealed off by a gasket. The cover 81 has a hatch 82 through which the test pins 70 and 77 are accessible. The inside of the cover 81 is treated with a foam release agent to facilitate removal of the foam during subsequent servicing of the assembly 30. A space of approximately one quarter of an inch exists between the cover 81 and the assembly 30 on all four sides and partly on top. The cover 81 has sufficient spout holes through which the foam is injected to provide proper venting while the foam is expanding. Preferably, the cover 81 is braced during the foaming operation to prevent bowing from the pressure of the foam. By this arrangement all the parts of the assembly 30 are held together by surface force rather than local screws.

When servicing is required, back out screws which may be conveniently located in the corners of the heat exchanger 80 are used to break free the cover 81 in order that it may be removed with the foam and sack attached leaving the assembly 30 free from foam and in a serviceable condition.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. In combination, (1) a structural member having a high thermal conductance and having a cross section in the shape of an inverted T formed by a web portion disposed perpendicular to a flange base portion, (2) a plurality of electrical components encapsulated to form a building block, (3) a plurality of said building blocks each having a first side adjacent to said web portion, (4) the electrical components of each of said blocks having their terminals extending through a second side of respective blocks opposite from said first side, (5) said blocks forming a plurality of rows of stacked blocks, (6) each of said rows being spaced with respect to the adjacent row to form spaces therebetween, (7) and a plurality of conductors disposed within each of said spaces, each of said conductors having one extremity connected to a respective terminal and its other extremity for connecting to a signal source.

2. In combination, (1) a structural member having a high thermal conductance and having a cross section in the shape of an inverted T formed by a web portion disposed perpendicular to a flange base portion, (2) heat exchanger means secured to said base portion, (3) a plurality of electrical components encapsulated to form a parallelepiped-shaped building block, (4) a plurality of said blocks each having a first side adjacent said web portion, (5) the electrical components of each of said blocks having terminals extending through a second side of respective blocks opposite from said first side, (6) said blocks forming a plurality of rows of stacked blocks, (7) each of said rows being spaced with respect to the adjacent row to form spaces therebetween, (8) a channel disposed in said spaces, (9) and a plurality of conductors disposed within each of said channels, each of said conductors having one extremity connected to a respective terminal and its other extremity for connecting to a signal source.

3. In a combination as recited in claim 2 wherein each of said blocks has end surfaces and each of said blocks is removably secured between two of said channels by means of its end surfaces by a frangible adhesive.

4. In a combination as recited in claim 2 in which the conductors disposed within a channel on one side of said row of blocks are connected to low-level signal sources only and the conductors disposed within the channel on the other side of said row of blocks are connected to relatively high-level signal sources thereby minimizing interference between high and low level signal carrying conductors.

5. In a combination as recited in claim 2 in which said other extremities of said conductors are connected to respective test pins and to said signal sources, said test pins protruding externally as to be available to test at least a portion of each of said blocks at a common predetermined remote location.

6. In a combination as recited in claim 2 in which said conductors are disposed in layers and each of said conductors is coded in accordance with its layer and relative position with respect to said terminals, and dielectric means disposed between adjacent layers of said conductors.

7. In combination, (1) a plurality of structural members each having a high thermal conductance and each having a cross section in the shape of an inverted T formed by a web portion disposed perpendicular to a flange base portion, (2) a plurality or electrical components encapsulated to form a parallelepiped-shaped building block, (3) a plurality of said blocks each having a first side adjacent respective web portions, (4) the electrical components of each of said blocks having terminals extending through a second side of said blocks opposite from said first side, (5) said blocks forming a plurality of rows of stacked blocks, (6) each of said rows being spaced with respect to the adjacent row to form spaces therebetween, (7) a plurality of channels disposed in respective spaces, (8) a plurality of conductors disposed within respective channels, each of said conductors having one extremity connected to a respective terminal, (9) a plurality of first pins connected to the other extremity of certain of said conductors,

(10) a common interconnection panel having second mating pins for connecting to respective first pins,

(11) said second pins being connected to respective signal sources,

(12) said first and second pins protruding externally and conveniently accessible for test purposes,

(13) and a common heat exchanger means connected to each of said base portions for removing the heat conducted therethrough.

References Cited by the Examiner

UNITED STATES PATENTS

| | | | |
|---|---|---|---|
| 3,098,951 | 7/63 | Ayer et al. | 317—101 |

OTHER REFERENCES

Electronic Design, "High Density Packaging-Structural

Design," C. B. Converse et al., pp. 60–63, July 19, 1961.

"Microminaturizing a Space Vehicle Computer," by Edwin Xeonjion, Electronics, pp. 95 to 98.

"Maintainable Electronic Component Assemblies," a bulletin of AMP Corp., 1961.

JOHN F. BURNS, *Primary Examiner.*